United States Patent
Kang et al.

(10) Patent No.: US 7,940,578 B2
(45) Date of Patent: May 10, 2011

(54) FLASH MEMORY DEVICE HAVING ROW DECODERS SHARING SINGLE HIGH VOLTAGE LEVEL SHIFTER, SYSTEM INCLUDING THE SAME, AND ASSOCIATED METHODS

(75) Inventors: Myoung-gon Kang, Suwon-si (KR); Yeong-taek Lee, Seoul (KR); Ki-tae Park, Seongnam-si (KR); Doo-gon Kim, Hwaseong-si (KR)

(73) Assignee: Samsung Electronics Co., ltd., Suwon-si, Gyeonggi-do (KR)

( * ) Notice: Subject to any disclaimer, the term of this patent is extended or adjusted under 35 U.S.C. 154(b) by 290 days.

(21) Appl. No.: 12/320,003

(22) Filed: Jan. 14, 2009

(65) Prior Publication Data
US 2009/0185422 A1 Jul. 23, 2009

(30) Foreign Application Priority Data

Jan. 21, 2008 (KR) ........................ 10-2008-0006236

(51) Int. Cl.
*G11C 5/14* (2006.01)
(52) U.S. Cl. .............................. 365/189.09; 365/189.11
(58) Field of Classification Search ............. 365/189.09, 365/189.11, 185.23, 185.17
See application file for complete search history.

(56) References Cited

U.S. PATENT DOCUMENTS

| | | | |
|---|---|---|---|
| 5,991,224 A | 11/1999 | Aipperspach et al. | |
| 6,704,223 B2 * | 3/2004 | Hosono et al. | 365/185.09 |
| 6,946,876 B2 * | 9/2005 | Isezaki et al. | 326/80 |
| 7,221,614 B2 | 5/2007 | Saito et al. | |
| 2005/0248993 A1 * | 11/2005 | Lee et al. | 365/185.29 |
| 2006/0083062 A1 * | 4/2006 | Park | 365/185.11 |
| 2007/0153602 A1 | 7/2007 | Kang | |

FOREIGN PATENT DOCUMENTS

| | | |
|---|---|---|
| JP | 2006-012337 A | 1/2006 |
| KR | 1999-0087899 A | 12/1999 |
| KR | 10-2006-0036512 A | 5/2006 |
| KR | 10-2007-0071612 A | 7/2007 |

* cited by examiner

Primary Examiner — Vu A Le
(74) Attorney, Agent, or Firm — Lee & Morse, P.C.

(57) ABSTRACT

A flash memory device includes first and second memory cell array blocks and a row decoder coupled to the first memory cell array block and the second memory cell array block. The row decoder includes a block decoder, a single high voltage level shifter that is coupled to both the first and second memory cell array blocks, the single high voltage level shifter configured to provide a block wordline signal of a high voltage to the first and second memory array blocks in response to a block selection signal received from the block decoder, a first pass transistor unit, and a second pass transistor unit.

13 Claims, 4 Drawing Sheets

FLASH MEMORY DEVICE HAVING ROW DECODERS SHARING SINGLE HIGH VOLTAGE LEVEL SHIFTER, SYSTEM INCLUDING THE SAME, AND ASSOCIATED METHODS

BACKGROUND

1. Technical Field

Embodiments relate to a flash memory device, a system including the same, and associated methods.

2. Description of the Related Art

A flash memory device may include a memory cell array, in which a plurality of memory cells serially connected to a single bitline constitute a single string, a plurality of memory cells connected to a single wordline constitute a page, and a plurality of pages constitute a block. In a NAND flash memory device having such a structure, a read operation and a program operation may be performed in units of pages, and an erasure operation may be performed in units of blocks.

A 3D stacked NAND flash memory device may be formed by stacking memory cell arrays in layers. Each of the memory layers may include a plurality of wordlines and a plurality of bitlines. Each memory layer may be connected to a respective row decoder. However, the provision of respective row decoders for each memory layer may increase a chip layout area. In order to reduce a chip layout area, a stacked NAND flash memory device may have many memory layers, e.g., four memory layers, that share a single row decoder. However, since the row decoder is connected to the wordlines of each of the four memory layers, a load on each wordline increases. Accordingly, the Number Of Program operations (NOP) for programming a selected memory cell may increase and, when every program operation which is repeated, a program disturbance may occur in memory cells within a page that are not supposed to be programmed.

SUMMARY

Embodiments are therefore directed to a flash memory device, a system including the same, and associated methods, which substantially overcome one or more of the problems due to the limitations and disadvantages of the related art.

It is therefore a feature of an embodiment to provide a flash memory device configured to reduce a chip layout area and reduce occurrence of program disturbances such as "soft" programming errors.

At least one of the above and other features and advantages may be realized by providing a flash memory device, including first and second memory cell array blocks, the first and second memory cell array blocks each including a plurality of wordlines and a plurality of bitlines, wherein a plurality of memory cells serially connected to each bitline constitute a single string, a plurality of memory cells connected to each wordline constitute a page, and a plurality of pages constitute a block, and a row decoder coupled to the first memory cell array block and the second memory cell array block. The row decoder may include a block decoder configured to provide a block selection signal in response to a first block signal and a second block signal, wherein the first block signal selects the first memory cell array block, and the second block signal selects the second memory cell array block, a single high voltage level shifter that is coupled to both the first and second memory cell array blocks, the single high voltage level shifter configured to provide a block wordline signal of a high voltage to the first and second memory array blocks in response to the block selection signal received from the block decoder, a first pass transistor unit configured to provide first driving voltages to the wordlines of the first memory cell array block in response to the block wordline signal received from the single high voltage level shifter, and a second pass transistor unit configured to provide second driving voltages to the wordlines of the second memory cell array block in response to the block wordline signal received from the single high voltage level shifter.

The first memory cell array block and the second memory cell array block may be stacked.

The block decoder may include a first block decoder configured to provide the first block signal in response to block address signals and a first memory cell array block selection signal, a second block decoder configured to provide the second block signal in response to the block address signals and a second memory cell array block selection signal, and a logic circuit unit configured to provide the block selection signal in response to the first and second block signals.

The first block decoder may include a NAND gate configured to receive the block address signals and the first memory cell array block selection signal, a fuse connected between an output of the NAND gate and the first block signal, and a PMOS transistor connected between a power supply voltage and the first block signal, the PMOS transistor having a gate connected to a ground voltage.

The second block decoder may include a NAND gate configured to receive the block address signals and the second memory cell array block selection signal, a fuse connected between an output of the NAND gate and the second block signal, and a PMOS transistor connected between a power supply voltage and the second block signal, the PMOS transistor having a gate connected to a ground voltage.

The logic circuit unit may include a NAND gate configured to receive the first and second block signals, and an inverter configured to receive an output of the NAND gate and to provide the block selection signal.

The single high voltage level shifter may include an inverter having an input configured to receive the block selection signal from the logic circuit unit, an NMOS transistor and a first high voltage NMOS depletion transistor serially connected between an output of the inverter and an output for the block wordline signal, the NMOS transistor and the first high voltage NMOS depletion transistor each having a gate connected to a power supply voltage, and a second high voltage NMOS depletion transistor and a high voltage PMOS transistor serially connected between a high voltage source and the input of the inverter. A gate of the second high voltage NMOS depletion transistor may be connected to the output for the block wordline signal, and a gate of the high voltage PMOS transistor may be connected to the input of the inverter.

The row decoder may further include a wordline driver configured to drive the first and second driving voltages, and the wordline driver may include an address decoder configured to decode row address signals for selecting the wordlines, and first and second memory cell array block selection signals, and a driving unit configured to drive a program voltage, an erase voltage, a read voltage, or a pass voltage to the first driving voltages or the second driving voltages, drive a ground selection voltage to a first or second ground selection signal, and drive a string selection voltage to a first or second string selection signal, in response to an output of the address decoder and control signals.

The first pass transistor unit may include high voltage NMOS transistors configured to provide the first string selection signal, the first driving voltages, and the first ground selection signal to a string selection line, the wordlines, and a ground selection line, respectively, of the first memory cell array block, and the high voltage NMOS transistors of the first pass transistor unit are configured to operate in response to the block wordline signal received from the output of the single high voltage level shifter.

The flash memory device may further include a string selection line ground switching unit configured to provide a string selection line ground voltage to the string selection lines of the first and second memory cell array blocks in response to the block selection signal.

The second pass transistor unit may include high voltage NMOS pass transistors configured to provide the second string selection signal, the second driving voltages, and the second ground selection signal to a string selection line, the wordlines, and a ground selection line, respectively, of the second memory cell array block, and the high voltage NMOS pass transistors of the second pass transistor unit may be configured to operate in response to the block wordline signal received from the output of the single high voltage level shifter.

The flash memory device may further include a string selection line ground switching unit configured to provide a string selection line ground voltage to the string selection lines of the first and second memory cell array blocks in response to the block selection signal.

At least one of the above and other features and advantages may also be realized by providing a system for processing data, including a processor, a memory configured to provide data to the processor, and a controller configured to control the memory, the memory including a flash memory device according to an embodiment.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
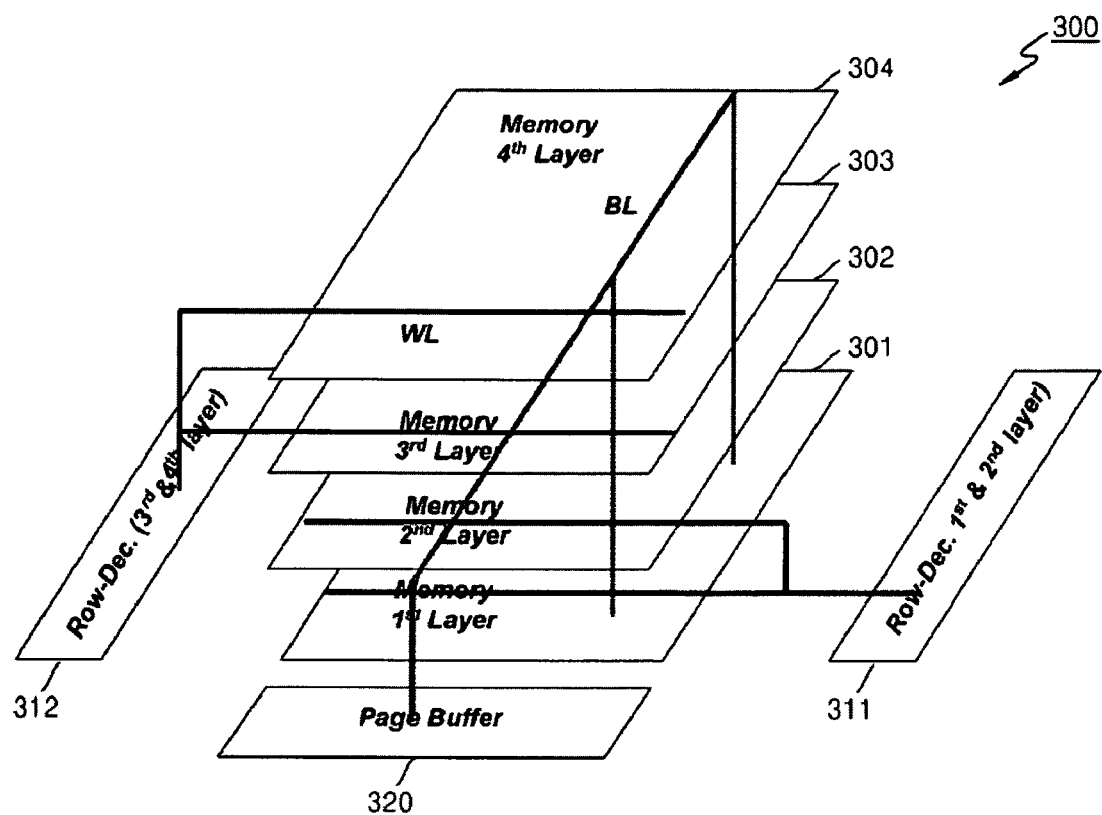
FIG. 1 illustrates a block diagram of a 3D stacked flash memory device according to an embodiment.

Korean Patent Application No. 10-2008-0006236, filed on Jan. 21, 2008, in the Korean Intellectual Property Office, and entitled: "Flash Memory Device Having Row Decoders Sharing Single High Voltage Level Shifter," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element is referred to as being "between" two other elements, it can be the only element between the two other elements, or one or more intervening elements may also be present. Like reference numerals refer to like elements throughout.

In a flash memory device according to an embodiment, a single row decoder may be shared by a plurality of memory cell array blocks, e.g., two memory cell array blocks. A block wordline signal of a high voltage may be generated by a single high voltage level shifter that is shared by the plurality of memory cell array blocks, thereby reducing the chip layout area.

The row decoder may include pass transistors configured to drive the wordlines of the memory cell array blocks in response to the block wordline signal, so as to correspond to the memory cell array blocks, respectively. Thus, a load upon each wordline may be reduced as compared with a case in which all of the wordlines of all memory layers are connected to a single row decoder. Therefore, generation of a signal disturbance according to the Number Of Program operations (NOP) may be reduced or eliminated.

FIG. 1 illustrates a block diagram of a 3D stacked flash memory device according to an embodiment. Referring to FIG. 1, the flash memory device 300 may be a 3D stacked flash memory device formed by stacking first through fourth memory layers, i.e., memory cell array blocks, 301 through 304. Wordlines WL of the first and second memory layers 301 and 302 may be connected to a first row decoder 311, and wordlines WL of the third and fourth memory layers 303 and 304 may be connected to a second row decoder 312. Bitlines BL of the first through fourth memory layers 301 through 304 may be connected to a common page buffer 120.

In the present embodiment, the four memory layers 301 through 304 may be stacked. However, the embodiment is not limited to this example, and a different number of memory layers may be stacked to form a flash memory device. The present embodiment may also be applied to planar-type flash memory devices, in which a plurality of memory cell array blocks are arrayed on a same plane. Accordingly, the memory layers 301 through 304 of the 3D stacked flash memory device 300 may be equivalent to the memory cell array blocks of a planar-type flash memory device.

Figure 2:
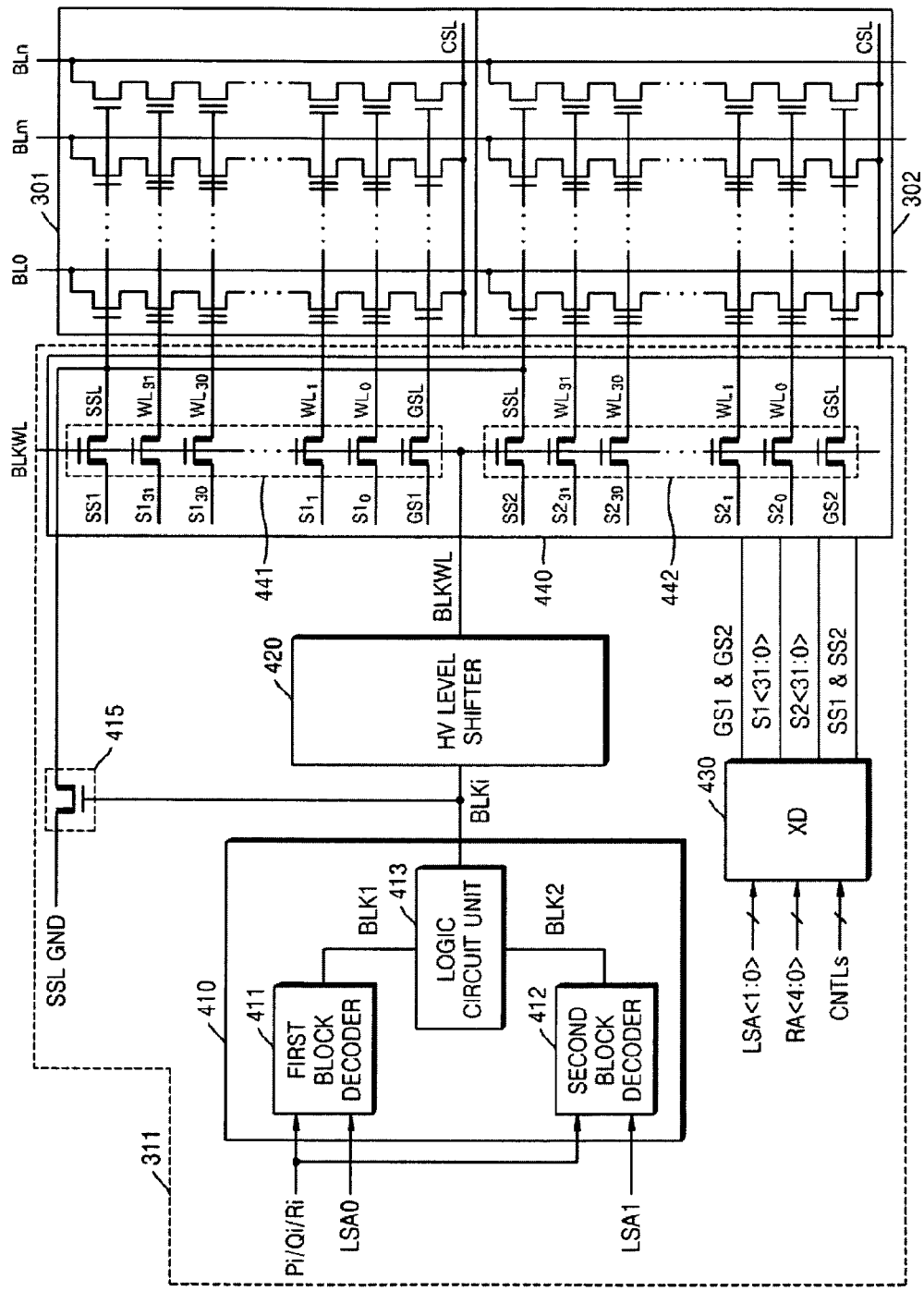
FIG. 2 illustrates a first row decoder of the flash memory device illustrated in FIG. 1.

FIG. 2 illustrates the first row decoder 311 of the flash memory device illustrated in FIG. 1. Referring to FIG. 2, the first row decoder 311 may include a block decoder unit 410, a string selection line ground switching unit 415, a single high voltage level shifter 420, a wordline driver 430, and a pass transistor unit 440 that includes a first pass transistor unit 441 and a second pass transistor unit 442.

The block decoder unit 410 may include a first block decoder 411 for selecting a block of the first memory layer 301, a second block decoder 412 for selecting a block of the second memory layer 302, and a logic circuit unit 413. The first block decoder 411 may decode block address signals Pi/Qi/Ri and a first memory layer selection signal LSA0 so as to generate a first block signal BLK1. The second block decoder 412 may decode the block address signals Pi/Qi/Ri and a second memory layer selection signal LSA1 so as to generate a second block signal BLK2. The logic circuit unit 413 may receive the first block signal BLK1 and the second block signal BLK2, generate a block selection signal BLKi, and transmit the block selection signal BLKi to the high voltage level shifter 420.

The string selection line ground switching unit 415 may provide a string selection line ground voltage SSLGND to string selection line SSL of the first and second memory layers 301 and 302 in response to the block selection signal BLKi output by the block decoder 410. The string selection line ground switching unit 415 may be connected between the string selection line ground voltage SSLGND and the string selection lines SSL, and may include a high voltage NMOS transistor having a gate to which the block selection signal BLKi is connected.

The high voltage level shifter 420 may generate a block wordline signal BLKWL having a high voltage VPP in response to the block selection signal BLKi.

The wordline driver 430 may decode memory layer selection signals LSA<1:0> and row address signals RA<4:0>, and may receive control signals CNTLs, so as to generate first and second ground selection signals GS1 and GS2, wordline driving signals S1<31:0> of the first memory layer 301, wordline driving signals S2<31:0> of the second memory layer 302, and first and second string selection signals SS1 and SS2. The wordline driver 430 may provide driving voltages for use in a program operation, an erase operation, or a read operation (e.g., a program voltage Vpgm, an erase voltage Verase, a read voltage Vread, or a pass voltage Vpass) to the wordline driving signals S1<31:0> of the first memory layer 301 or the wordline driving signals S2<31:0> of the second memory layer 302. The wordline driver 430 may provide a ground selection voltage VGSL to the first or second ground selection signal GS1 or GS2, and may provide a string selection voltage VSSL to the first or second string selection signal SS1 or SS2.

The pass transistor unit 440 may include the first pass transistor unit 441 and the second pass transistor unit 442. The first pass transistor unit 441 may provide the first string selection signal SS1, the wordline driving signals S1<31:0>, and the first ground selection signal GS1 to the string selection line SSL, wordlines WL<31:0>, and a ground selection line GSL of the first memory layer 301, respectively, in response to the block wordline signal BLKWL. The second pass transistor unit 442 may provide the second string selection signal SS2, the wordline driving signals S2<31:0>, and the second ground selection signal GS2 to the string selection line SSL, wordlines WL<31:0>, and a ground selection line GSL of the second memory layer 302, respectively, in response to the block wordline signal BLKWL.

The high voltage level shifter unit 420 may provide the block wordline signal BLKWL to the first and second pass transistor units 441 and 442. In particular, the first and second pass transistor units 441 and 442 may each include high voltage NMOS transistors having gates to which the block wordline signal BLKWL is connected.

Figure 3:
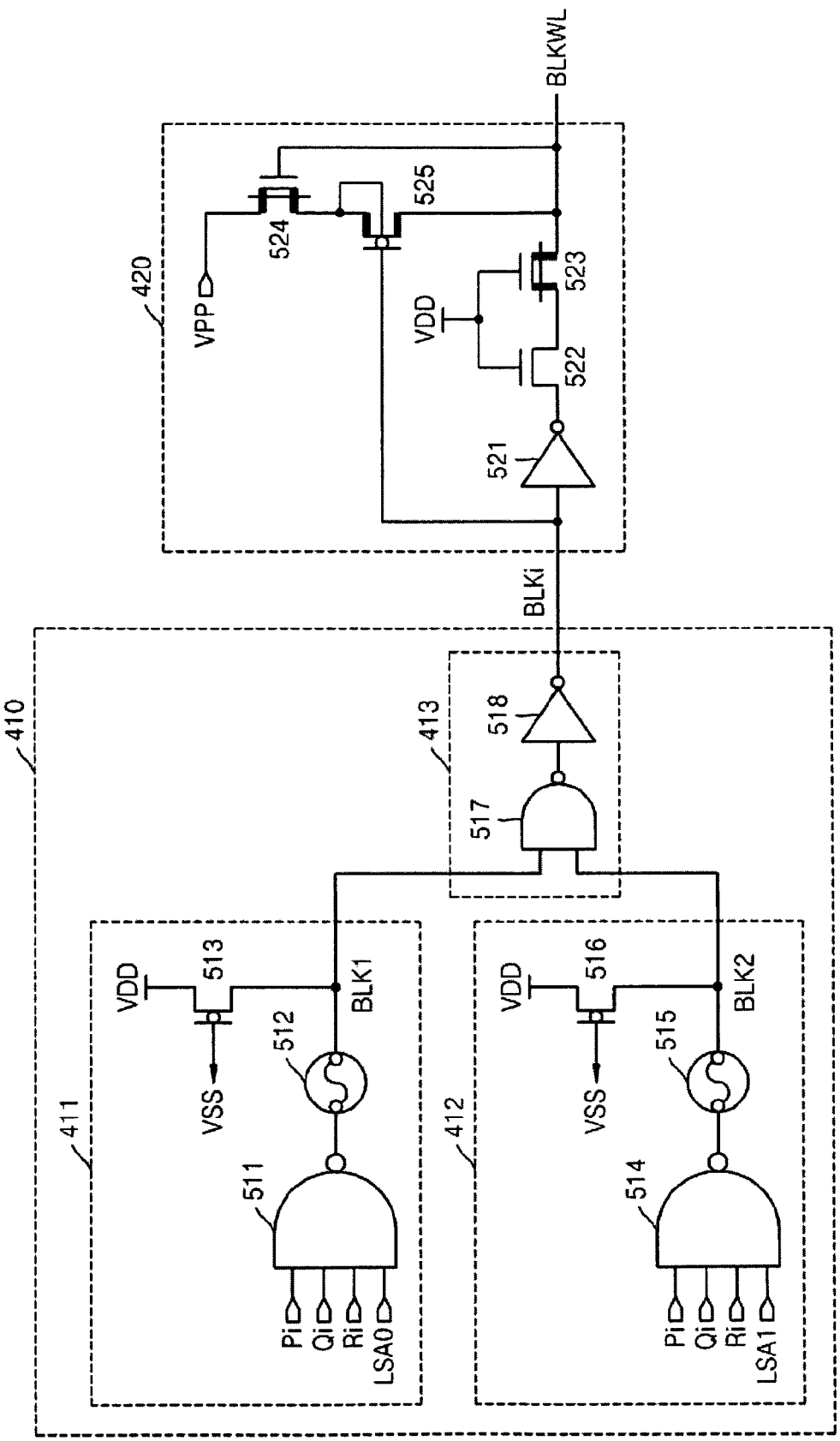
FIG. 3 illustrates a circuit diagram of a block decoder unit and a high voltage level shifter unit of the first row decoder illustrated in FIG. 2.

FIG. 3 illustrates a circuit diagram of the block decoder unit 410 and the high voltage level shifter unit 420 of FIG. 2. Referring to FIG. 3, the first block decoder 411 of the block decoder unit 410 may include a first NAND gate 511 configured to receive the block address signals Pi/Qi/Ri and the first memory layer selection signal LSA0. The first block decoder 411 may also include a first fuse 512 connected between an output of the first NAND gate 511 and the first block signal BLK1. The first block decoder 411 may also include a first PMOS transistor 513 that is connected between a power supply voltage VDD and the first block signal BLK1, and which has a gate to which a ground voltage VSS is connected.

The second block decoder 412 may include a second NAND gate 514 for receiving the block address signals Pi/Qi/Ri and the second memory layer selection signal LSA1. The second block decoder 412 may also include a second fuse 515 connected between an output of the second NAND gate 514 and the second block signal BLK2. The second block decoder 412 may also include a second PMOS transistor 516 that is connected between the power supply voltage VDD and the second block signal BLKi, and which has a gate to which the ground voltage VSS is connected.

The logic circuit unit 413 may include a NAND gate 517 configured to receive the first block signal BLK1 and the second block signal BLK2 from the first and second block decoders 411 and 412, respectively. The logic circuit unit 413 may also include an inverter 518 configured to receive an output of the NAND gate 517, so as to generate the block selection signal BLKi that is provided to the high voltage level shifter unit 420.

The high voltage level shifter unit 420 may provide the high voltage VPP to the block wordline signal BLKWL in response to the block selection signal BLKi received from the logic circuit unit 413. In particular, in the high voltage level shifter unit 420, the block selection signal BLKi may be input to an inverter 521, and an output of the inverter 521 may be output to the block wordline signal BLKWL via an NMOS transistor 522 and a first depletion transistor 523. Gates of the NMOS transistor 522 and the first high voltage NMOS depletion transistor 523 may be connected to the power supply voltage VDD. The inverter 521 may be driven by the power supply voltage VDD. The high voltage level shifter unit 420 may further include a second high voltage NMOS depletion transistor 524 and a high voltage PMOS transistor 525 that are serially connected between the high voltage VPP and the block wordline signal BLKWL. A gate of the second high voltage NMOS depletion transistor 524 may be connected to the block wordline signal BLKWL, and a gate of the high voltage PMOS transistor 525 may be connected to the block selection signal BLKi.

Figure 4:
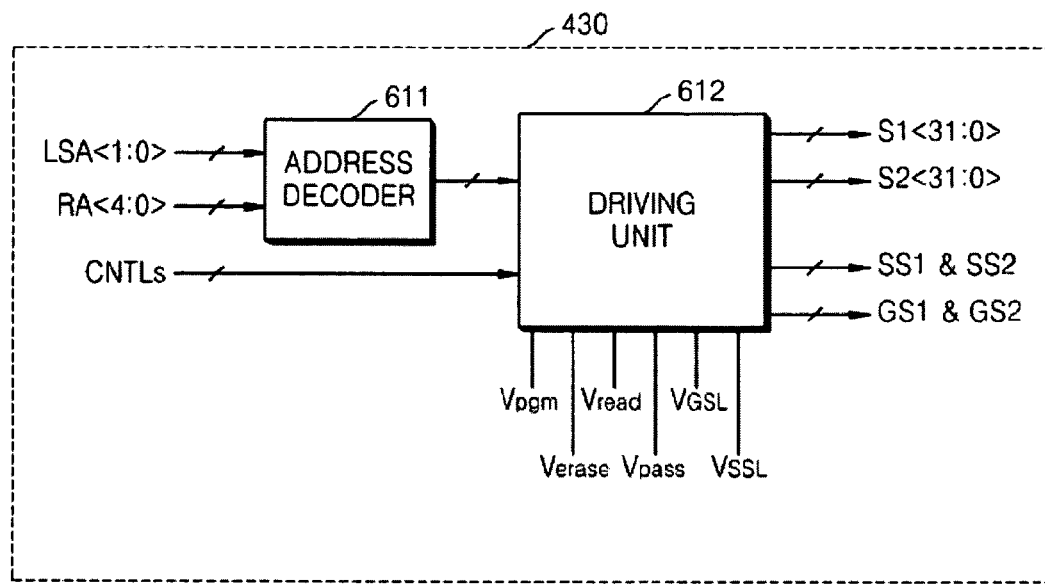
FIG. 4 illustrates a block diagram of a wordline driver of the first row decoder illustrated in FIG. 2.

FIG. 4 illustrates a block diagram of the wordline driver 430 of FIG. 2. Referring to FIG. 4, the wordline driver 430 may include an address decoder 611 and a driving unit 612. The address decoder 611 may decode the row address signals RA<4:0> for selecting the wordlines WL<31:0>, and the memory layer selection signals LSA<1:0>. The driving unit 612 may drive the program voltage Vpgm, the erase voltage Verase, the read voltage Vread, or the pass voltage Vpass to the wordline driving signals S1<31:0> of the first memory layer 301 or the wordline driving signals S2<31:0> of the second memory layer 302, drive the ground selection voltage VGSL to the first or second ground selection signal GS1 or GS2, and drive the string selection voltage VSSL to the first or second string selection signal SS1 or SS2, in response to an output of the address decoder 611 and the control signals CNTLs.

Operations of the circuits illustrated in FIGS. 3 and 4 will now be described in connection with one another.

The first fuse 512 of the block decoder unit 410 may be cut when the first memory layer 301 of FIG. 2 includes a bad block, and the second fuse 515 thereof may be cut when the second memory layer 302 of FIG. 2 includes a bad block. For example, assuming that the second memory layer 302 includes a bad block, the second fuse 515 may be cut. In this case, when the first memory layer 301 is selected, the high voltage level shifter 420 may generate the block wordline signal BLKWL of the high voltage VPP in response to the block selection signal BLKi in a low logic level generated by the first block decoder 411.

According to a program operation, an erase operation, or a read operation, the wordline driver 430 may drive the program voltage Vpgm, the erase voltage Verase, the read voltage Vread, or the pass voltage Vpass to the wordline driving signals S1<31:0> of the first memory layer 301, drive the ground selection voltage VGSL to the first ground selection signal GS1, and drive the string selection voltage VSSL to the first string selection signal SS1, in response to the decoded row address signals RA<4:0> and the decoded control signals CNTLs. In response to the block wordline signal BLKWL of the high voltage VPP, the first string selection signal SS1, the wordline driving signals S1<31:0>, and the first ground selection signal GS1 may be provided to the string selection line SSL, the wordlines WL<31:0>, and the ground selection line GSL of the first memory layer 301 by the first pass transistor unit 441.

The wordline driver 430 may disable the wordline driving signals S2<31:0> of the second memory layer 302, the second ground selection signal GS2, and the second string selection signal SS2 by using the ground voltage VSS.

In another example, if the second fuse 515 is cut and, in this state, the second memory layer 302 is selected, the high voltage level shifter 420 may provide the block wordline signal BLKWL of the ground voltage VSS in response to the block selection signal BLKi of a logic high level generated by the second block decoder 412. Accordingly, the first pass transistor unit 441 and the second pass transistor unit 442 may be blocked so that none of the first memory layer 301 and the second memory layer 302 are selected.

The above-described operations are summarized in Table 1, below.

TABLE 1

| Signal | Memory layer | Program operation | Read operation | Erase operation |
|---|---|---|---|---|
| Selected wordline | — | Vpgm | Vread | Verase |
| Non-selected wordline | First memory layer | Vpass | Vread | Verase |
| | Second memory layer | 0 | 0 | Vdd Floating |
| BLKWL | — | VPP | VPP | Vdd |
| SSL | First memory layer | Vxx | Vread | Floating |
| | Second memory layer | 0 | 0 | Floating |
| GSL | First memory layer | 0 | Vread | Floating |
| | Second memory layer | 0 | 0 | Floating |
| CSL | — | 1.5 | 0 | Floating |

In the flash memory device according to the current embodiment, the stacked two memory layers 301 and 302 may share the single row decoder 311, and thus a chip layout area may be reduced as compared with a flash memory device having a number of row decoders that is equal to the number of memory layers. In particular, the row decoder 311 may generate the block wordline signal BLKWL of the high voltage VPP by using the high voltage level shifter 420 that is shared by the memory layers 301 and 302, thereby reducing the chip layout area. In addition, the row decoder 311 may include the pass transistors 441 and 442 for driving the wordlines WL<31:0> of the first and second memory layers 301 and 302 in response to the block wordline signal BLKWL, so as to correspond to the first and second memory layers 301 and 302, respectively. Thus, a load upon each wordline may be reduced as compared with a device in which all of the wordlines of memory layers are connected to a single row decoder. Therefore, generation of a signal disturbance according to the Number Of Program operations (NOP) may be reduced or eliminated.

Figure 5:
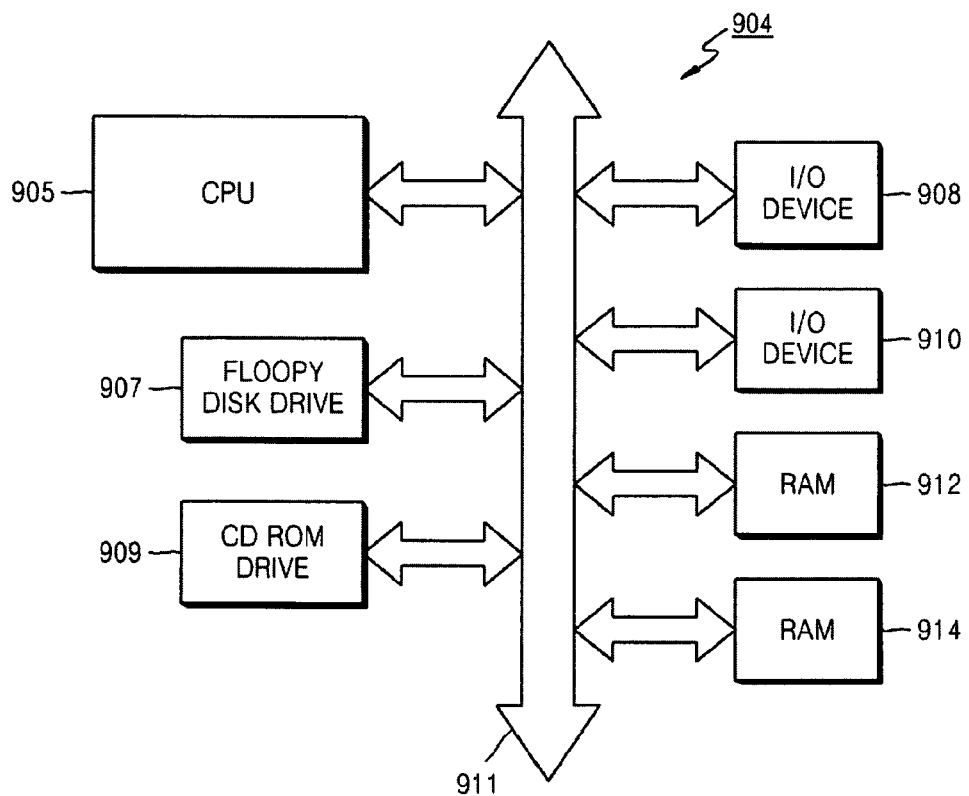
FIG. 5 illustrates a system for processing data, the system including a flash memory device according to an embodiment.

FIG. 5 illustrates a system 904 for processing data, the system 904 including a flash memory device according to an embodiment. The flash memory device according to an embodiment may be used for code and/or data storage, and may be implemented as, e.g., a RAM 912. The system 904 may include a central processing unit (CPU) 905, e.g., a microprocessor, which communicates with the RAM 912 over a bus 911.

One or more input and/or output devices 908, 910, e.g., a keypad, a display, etc., may be coupled to bus 911. The system 904 may also include a read-only memory (ROM) 914, e.g., for storing boot instructions, firmware, etc. The ROM 914 may be an EEPROM according to an embodiment. In some implementations, the system 904 may also provide for external storage media, e.g., hard drives, optical or magneto-optical drives, floppy disk drives, etc., such as compact disk (CD) ROM drive 909 and floppy disk drive 907.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
   first and second memory cell array blocks, the first and second memory cell array blocks each including a plurality of wordlines and a plurality of bitlines, wherein a plurality of memory cells serially connected to each bitline constitute a single string, a plurality of memory cells connected to each wordline constitute a page, and a plurality of pages constitute a block; and
   a row decoder coupled to the first memory cell array block and the second memory cell array block, wherein the row decoder includes:
   a block decoder configured to provide a block selection signal in response to a first block signal and a second block signal, wherein the first block signal selects the first memory cell array block, and the second block signal selects the second memory cell array block,
   a single high voltage level shifter that is coupled to both the first and second memory cell array blocks, the single high voltage level shifter configured to provide a block wordline signal of a high voltage to the first and second memory array blocks in response to the block selection signal received from the block decoder,
   a first pass transistor unit configured to provide first driving voltages to the wordlines of the first memory cell array block in response to the block wordline signal received from the single high voltage level shifter, and
   a second pass transistor unit configured to provide second driving voltages to the wordlines of the second memory cell array block in response to the block wordline signal received from the single high voltage level shifter.

2. The flash memory device as claimed in claim 1, wherein the first memory cell array block and the second memory cell array block are stacked.

3. The flash memory device as claimed in claim 1, wherein the block decoder comprises:
   a first block decoder configured to provide the first block signal in response to block address signals and a first memory cell array block selection signal;
   a second block decoder configured to provide the second block signal in response to the block address signals and a second memory cell array block selection signal; and
   a logic circuit unit configured to provide the block selection signal in response to the first and second block signals.

4. The flash memory device as claimed in claim 3, wherein the first block decoder comprises:

a NAND gate configured to receive the block address signals and the first memory cell array block selection signal;

a fuse connected between an output of the NAND gate and the first block signal; and a PMOS transistor connected between a power supply voltage and the first block signal, the PMOS transistor having a gate connected to a ground voltage.

5. The flash memory device as claimed in claim 3, wherein the second block decoder comprises:

a NAND gate configured to receive the block address signals and the second memory cell array block selection signal;

a fuse connected between an output of the NAND gate and the second block signal; and a PMOS transistor connected between a power supply voltage and the second block signal, the PMOS transistor having a gate connected to a ground voltage.

6. The flash memory device as claimed in claim 3, wherein the logic circuit unit comprises:

a NAND gate configured to receive the first and second block signals; and an inverter configured to receive an output of the NAND gate and provide the block selection signal.

7. The flash memory device as claimed in claim 3, wherein the single high voltage level shifter comprises:

an inverter having an input configured to receive the block selection signal from the logic circuit unit;

an NMOS transistor and a first high voltage NMOS depletion transistor serially connected between an output of the inverter and an output for the block wordline signal, the NMOS transistor and the first high voltage NMOS depletion transistor each having a gate connected to a power supply voltage; and a second high voltage NMOS depletion transistor and a high voltage PMOS transistor serially connected between a high voltage source and the input of the inverter, wherein:

a gate of the second high voltage NMOS depletion transistor is connected to the output for the block wordline signal, and a gate of the high voltage PMOS transistor is connected to the input of the inverter.

8. The flash memory device as claimed in claim 7, wherein: the row decoder further includes a wordline driver configured to drive the first and second driving voltages, and the wordline driver includes:

an address decoder configured to decode row address signals for selecting the wordlines, and first and second memory cell array block selection signals; and a driving unit configured to drive a program voltage, an erase voltage, a read voltage, or a pass voltage to the first driving voltages or the second driving voltages, drive a ground selection voltage to a first or second ground selection signal, and drive a string selection voltage to a first or second string selection signal, in response to an output of the address decoder and control signals.

9. The flash memory device as claimed in claim 8, wherein:

the first pass transistor unit includes high voltage NMOS transistors configured to provide the first string selection signal, the first driving voltages, and the first ground selection signal to a string selection line, the wordlines, and a ground selection line, respectively, of the first memory cell array block, and the high voltage NMOS transistors of the first pass transistor unit are configured to operate in response to the block wordline signal received from the output of the single high voltage level shifter.

10. The flash memory device as claimed in claim 9, further comprising a string selection line ground switching unit configured to provide a string selection line ground voltage to the string selection lines of the first and second memory cell array blocks in response to the block selection signal.

11. The flash memory device as claimed in claim 9, wherein:

the second pass transistor unit comprises high voltage NMOS pass transistors configured to provide the second string selection signal, the second driving voltages, and the second ground selection signal to a string selection line, the wordlines, and a ground selection line, respectively, of the second memory cell array block, and the high voltage NMOS pass transistors of the second pass transistor unit are configured to operate in response to the block wordline signal received from the output of the single high voltage level shifter.

12. The flash memory device as claimed in claim 11, further comprising a string selection line ground switching unit configured to provide a string selection line ground voltage to the string selection lines of the first and second memory cell array blocks in response to the block selection signal.

13. A system for processing data, comprising:

a processor;

a memory configured to provide data to the processor; and a controller configured to control the memory, wherein the memory includes a flash memory device as claimed in claim 1.

\* \* \* \* \*